United States Patent
Kong et al.

(10) Patent No.: US 8,713,411 B2
(45) Date of Patent: Apr. 29, 2014

(54) ENCODING AND/OR DECODING MEMORY DEVICES AND METHODS THEREOF

(75) Inventors: Jun Jin Kong, Yongin-si (KR); Yong June Kim, Seoul (KR); Jae Hong Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 932 days.

(21) Appl. No.: 12/232,258

(22) Filed: Sep. 12, 2008

(65) Prior Publication Data

US 2009/0241009 A1 Sep. 24, 2009

(30) Foreign Application Priority Data

Mar. 18, 2008 (KR) .................. 10-2008-0024929

(51) Int. Cl.
*H03M 13/00* (2006.01)

(52) U.S. Cl.
USPC ......................................... 714/774; 714/776

(58) Field of Classification Search
USPC .................................. 714/774, 776
See application file for complete search history.

(56) References Cited

U.S. PATENT DOCUMENTS

| | | | |
|---|---|---|---|
| 3,893,071 A | 7/1975 | Bossen et al. | |
| 5,600,663 A * | 2/1997 | Ayanoglu et al. | 714/774 |
| 6,621,871 B2 * | 9/2003 | Ross et al. | 375/262 |
| 7,227,797 B2 * | 6/2007 | Thayer et al. | 365/201 |
| 7,269,781 B2 | 9/2007 | Weissman et al. | |
| 2002/0004060 A1 | 1/2002 | Heublein et al. | |
| 2007/0204067 A1 * | 8/2007 | Walker et al. | 709/247 |

FOREIGN PATENT DOCUMENTS

| | | |
|---|---|---|
| JP | S59-84141 | 6/1984 |
| JP | 01-208029 | 8/1989 |
| JP | 06-161906 | 6/1994 |
| JP | 10-117287 | 5/1998 |
| JP | 11-065944 | 3/1999 |
| JP | 11-317675 | 11/1999 |
| JP | 2006-260619 | 9/2006 |
| KR | 10-2001-0113792 | 12/2001 |
| KR | 10-2007-0040157 A | 4/2007 |

OTHER PUBLICATIONS

PCT Written Opinion and International Search Report.

* cited by examiner

*Primary Examiner* — M. Mujtaba K Chaudry
(74) *Attorney, Agent, or Firm* — Harness, Dickey & Pierce, P.L.C.

(57) ABSTRACT

Encoding/decoding memory devices and methods thereof may be provided. A memory device according to example embodiments may include a memory cell array and a processor including at least one of a decoder and an encoder. The processor may be configured to adjust a redundant information rate of each channel, where each of the channels is a path of the memory cell array from which data is at least one of stored and read. The redundant information rate may be adjusted by generating at least one codeword based on information from a previous codeword. Therefore, example embodiments may reduce an error rate when data is read from and written to the memory device.

19 Claims, 7 Drawing Sheets

ENCODING AND/OR DECODING MEMORY DEVICES AND METHODS THEREOF

PRIORITY STATEMENT

This application claims the benefit of Korean Patent Application No. 10-2008-0024929, filed on Mar. 18, 2008, in the Korean Intellectual Property Office, the disclosure of which is incorporated herein by reference.

BACKGROUND

1. Field

Example embodiments relate to error-control codes (ECC), for example, to ECC encoding/decoding methods for memory devices.

2. Description of Related Art

Generally, a path for transmitting information may be referred to as a channel. When information is transmitted using wired communication, the channel may be a transmission line transmitting the information, and when information is transmitted using a wireless communication, the channel may be electromagnetic waves passing the information through air.

Also, a process of storing information in a semiconductor memory device and reading the stored information from the semiconductor memory device may be the channel. The channel may be a temporal lapse from storing of the information to reading of the information, and may also be a physical path of storing information in the semiconductor memory device and reading the stored information from the semiconductor memory device.

While information is being transmitted via the channel, the information may be corrupted. The corrupted information may include an error and thus research is being conducted on apparatuses and methods of detecting the error from the corrupted information and eliminating the detected error to restore the initial information.

A process of adding ECC to the initial information prior to transmitting the information to thereby generate transmission information may be referred to as an ECC encoding process. A process of separating the added information and the initial information after receiving the transmission information to thereby restore the initial information may be referred to as an ECC decoding process.

Depending on channel characteristics, an error rate in the channel may be relatively large. As the error rate increases, a code rate may decrease and/or hardware complexity for ECC encoding and decoding scheme may increase in order to overcome the error and achieve the desired performance.

SUMMARY

According to example embodiments, it may be possible to reduce an error rate of memory devices when reading/writing data by using a new error-control codes (ECC) encoding and/or decoding scheme for the memory devices.

According to example embodiments, it may be possible to reduce an error rate in a critical data page by selecting a new ECC encoding and/or decoding scheme for memory devices of multi-level cell (MLC) or multi-bit cell (MBC).

According to example embodiments, a memory device may include a memory cell array and a processor including at least one of a decoder and an encoder. The processor may be configured to adjust a redundant information rate of each channel, where each of the channels is a path of the memory cell array from which data is at least one of stored and read.

The redundant information rate may be adjusted by generating at least one codeword based on information from a previous codeword.

A memory device according to example embodiments may include a memory cell array and a decoder. The decoder may perform an ECC decoding with respect to a first codeword generated from first data being read in the memory cell array to estimate a first message, combine the estimated first message and second data being read from the memory cell array to generate a second codeword, and perform ECC decoding with respect to the second codeword to estimate a second message.

A memory device according to example embodiments may include a memory cell array, an encoder, and a programming unit. The encoder may perform an ECC encoding with respect to a first message to generate a first codeword, and performing ECC encoding with respect to the first message and a second message to generate a second codeword. The programming unit may store the first and second codeword in the memory cell array.

According to example embodiments, a coding method may include performing at least one of error-control code (ECC) decoding and encoding, with a redundant information rate of each channel being adjusted, where each of the channels is a path of a memory cell array from which data is at least one of stored and read, and the redundant information rate is adjusted by generating at least one codeword based on information from a previous codeword.

A decoding method according to example embodiments may include performing an ECC decoding with respect to a first codeword generated from received first data to estimate a first message, combining the estimated first message and received second data to generate a second codeword and performing ECC decoding with respect to the second codeword to estimate a second message.

An encoding method according to example embodiments may include performing an ECC encoding with respect to a first message to generate a first codeword and performing ECC encoding with respect to the first message and a second message to generate a second codeword.

Additional aspects, features, and/or advantages of example embodiments will be set forth in part in the description which follows and, in part, will be apparent from the description, or may be learned by practice of example embodiments.

BRIEF DESCRIPTION OF THE DRAWINGS

The above and/or other aspects, features, and advantages of example embodiments will become apparent and more readily appreciated from the following description of example embodiments, taken in conjunction with the accompanying drawings of which.

DETAILED DESCRIPTION OF EMBODIMENTS

Figure 1:
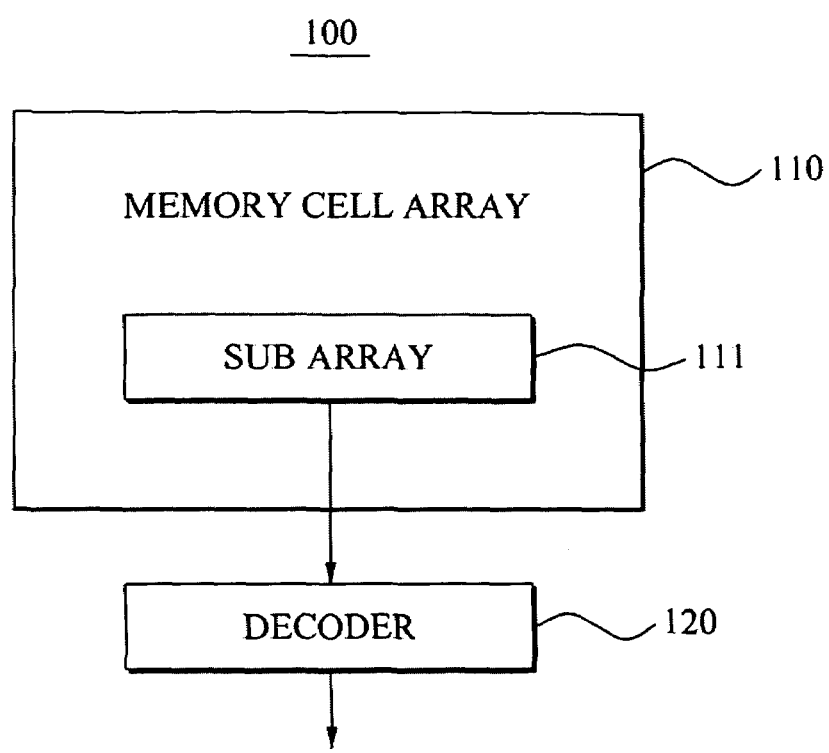
FIG. 1 is a diagram illustrating a memory device according to example embodiments.

Example embodiments will now be described more fully with reference to the accompanying drawings. In the drawings, the thicknesses of layers and regions may be exaggerated for clarity.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Now, in order to more specifically describe example embodiments, example embodiments will be described in detail with reference to the attached drawings. However, example embodiments are not limited to the embodiments described herein, but may be embodied in various forms.

FIG. 1 is a diagram illustrating a memory device 100 according to example embodiments.

Referring to FIG. 1, the memory device 100 includes a memory cell array 110 and a decoder 120.

The memory cell array 110 includes a plurality of memory cells. A sub array 111 included in the memory cell array 110 may be a set of memory cells which are simultaneously read by the decoder 120. The decoder 120 may simultaneously read data from memory cells of the sub array 111.

Depending on example embodiments, the sub array 111 may be a set of memory cells connected to a single word line (not shown). The memory device 100 may simultaneously read data from the memory cells in the sub array 111 by applying a specific voltage to the word line connected to the sub array 111. The set of memory cells connected to the single word line may be referred to as a memory page.

The decoder 120 may perform error-control codes (ECC) decoding with respect to a first codeword which may be generated from a first data read in the sub array 111 to thereby estimate a first message. The decoder 120 may also read a second data from the sub array 111. The decoder 120 may combine the estimated first message and the read second data to generate a second codeword. The decoder 120 may perform ECC decoding with respect to the second codeword to estimate a second message.

From among the ECCs, those types of codes which clearly distinguish between a message and redundant information may be referred to as systematic codes, and those types of codes which do not clearly distinguish between the message and the redundant information may be referred to as non-systematic codes. For example, redundant information may include one or more parity bits.

When the decoder 120 selects the ECC decoding scheme using systematic codes, a first codeword may be divided into to a first message and a first parity. The first message and the first parity may have an error occur while the decoder 120 reads data in the sub array 111. The decoder 120 may detect the error, which may be included in the first codeword, by performing ECC decoding with respect to the first codeword, and may correct all detected errors when a bit error rate (BER), which is a rate of the detected error to information of the first codeword, is equal to or less than a correctable range of the decoder 120. For example, when the number of an error bit of a 1000-bit codeword is 10, a BER may be represented as $10/1000=10^{(-2)}$.

Depending on example embodiments, when an error rate of a first codeword is equal to or less than a threshold error rate, the decoder 120 may reduce an error rate of the ECC decoded first codeword to equal to or less than a target error rate.

Depending on example embodiments, an error occurrence level of a first codeword or a second codeword may be represented by a symbol error rate.

The first parity may be redundant information for an occurrence of an error. The decoder 120 may estimate data, from among the first message and the first parity, before the first message is stored in the sub array 111. In this instance, a result of performing the ECC decoding by the decoder 120 may be an estimated first message, and the first parity may be deleted.

The decoder 120 may read the second data from the sub array 111. The second data may be divided in to a first message, a second message, and a second parity. Similarly, an error may occur while data included in the second data is stored in the sub array 111 and read from the sub array 111. The decoder 120 may combine the estimated first message and the read second data to generate the second codeword. The decoder 120 may perform ECC decoding with respect to the second codeword to detect an error which may be included in the second codeword, and may correct the detected error.

Depending on example embodiments, the decoder 120 may substitute a portion of the first message from among the second data with the estimated first message. In this instance, the generated second codeword may include at least a portion of the estimated first message, the second message read from the sub array 111, and the second parity read from the sub array 111. The decoder 120 may perform ECC decoding with respect to the second codeword to generate a re-estimated first message and an estimated second message.

The second parity may be redundant information for an occurrence of an error in the first message and the second message. The decoder 120 may estimate the second message before storing it in the sub array 111, based on the estimated first message, the second message, and the second parity. Further, the decoder 120 may repeatedly estimate the estimated first message. Since the re-estimated first message has gone through ECC decoding twice, a BER of the re-estimated first message may be much less than a BER of the first message read from the sub array 111. A decrease in the rate from a BER of the first message read from the sub array 111 to a BER of the re-estimated first message may be larger than a decrease in the rate from a BER of the second message read from the sub array 111 to a BER of the estimated second message.

For example, assuming that a BER decreases by $1/10$ from a one-time ECC decoding, there may be relations like BER[m1]/BER[m1(2)]=100, and BER[m2]/BER[m2(1)]=10, where "m1" denotes a first message, "m1(2)" denotes a re-estimated first message, "m2" denotes a second message and "m2(1)" denotes an estimated second message.

Depending on example embodiments, the decoder 120 may read all of the remaining data, except the first message, as the second data. In this instance, the second data may include the second message and the second parity, and the decoder 120 may generate the second codeword by combining the estimated first message and the second data.

A path that data is stored at and then read from in the sub array 111 may be considered as a single channel. An error may occur while data passes through a channel, and the decoder 120 may detect the error included in the data and correct the detected error.

An example of codes having clearly shown error correctability are block codes. Examples of block codes include Bose, Ray-Chaudhuri, Hocquenghem (BCH) codes, Reed-Solomon (RS) codes, and the like. Examples of decoding schemes for such block codes include a Meggitt decoding scheme, a Berlekamp-Massey decoding scheme, a Euclid decoding scheme, and the like.

A path where first data is stored at and read from the sub array 111 may be referred to as a first channel. A path where second data is stored at and read from the sub array 111 may be referred to as a second channel. A re-estimated first message may have an extremely low BER since the first message included in first data, which passed through the first channel, goes through ECC decoding twice. An estimated second message may have extremely low BER since second data, which passed through a second channel, may be combined with the first message being estimated through ECC decoding once. Since an estimated first message has comparatively lower BER, a BER of a second codeword generated after the second message and the estimated first message combined may be smaller than a BER of the second message. Even when the BER of the second message is larger than a correctable range by the decoder 120, a BER of the generated second codeword may be equal to or less than a correctable range by the decoder 120. The decoder 120 may perform ECC decoding with respect to the second codeword generated by combining the first message and the second message, thereby increasing error correctability of the second message.

According to embodiment, it may be possible to sequentially perform ECC decoding with respect to data which is be received via different channels, and perform ECC decoding with respect to a message which is estimated prior to the sequential performing of the decoding, thereby reducing a BER of ECC decoded data.

If a decrease in the BER from performing ECC decoding twice is larger than a decrease in the BER from combining an estimated different message and performing ECC decoding, the memory device 100 may establish a channel having a BER that is comparatively larger as a first channel, and may establish a channel having a BER this is comparatively smaller as a second channel, thereby increasing a BER decrease. In this instance, since the comparatively larger BER of the first channel may be reduced by going through the ECC decoding twice, a re-estimated BER of the first message and an estimated BER of the second massage may have a similar level.

A decrease in the BER from combining the estimated different message may be larger than the decrease in the BER from performing ECC decoding twice. In that case, the memory device 100 may establish a channel having comparatively smaller BER as a first channel and establish a channel having comparatively larger BER as a second channel. The memory device 100 may decrease the maximum BER based on channel characteristics and decoding efficiency.

Depending on example embodiments, the decoder 120 may select a decoding scheme based on the characteristics of a channel. The decoder 120 may select a first decoding scheme based on characteristics of the first channel for the ECC decoding operation of the first codeword. The decoder 120 may select a second decoding scheme based on characteristics of the second channel for the ECC decoding operation of the second codeword.

Decoding schemes applicable to example embodiments may, for example use low density parity check (LDPC) codes or convolutional codes. ECCs applicable to example embodiments may include, LDPC codes (RA, zigzag), Convolutional codes, RSC codes, Turbo codes, BHC codes, RS codes, Goppa codes, RM codes, and the like.

According to example embodiments, sequences of the ECC decoding operations may be determined based on different characteristics of the channels. The ECC decoded data may be combined according to the determined sequences to perform ECC decoding with respect to the ECC decoded data, thereby reducing an error rate in a channel having poor characteristics. Also, according to example embodiments, it may be possible to increase error correctability by reducing an error rate in a channel having poor characteristics.

A single-level cell (SLC) memory device may store one bit of data in a single memory cell. The SLC memory may be referred to as a single-bit cell (SBC) memory. An operation of storing data of one bit in a single-level cell of the SLC memory may be referred to as a programming operation and may change a threshold voltage of the single-level cell. Depending on whether data of one bit to be stored is "0" or "1," a memory of the single-level cell may have a high-level threshold voltage or a low-level threshold voltage. An operation of reading the data stored in the single-level cell may be performed by sensing a threshold voltage in the single-level cell and by determining whether the sensed voltage is larger than a reference voltage or a read voltage.

When the memory device 100 applies a specific voltage associated with a level of the read voltage to a word line where memory cells of the sub array 111 are connected, a current flowing from each of the connected bit lines may be determined depending whether a level of a threshold voltage of each of the memory cells of the sub array 111 is larger than a level of the read voltage. The decoder 120 may sense the current flowing from each of the connected bit lines and may determine a range of the threshold voltage in each of the memory cells of the sub array 111 based on the sensed current.

The programmed threshold voltage may have a distribution within a certain range due to a fine electric characteristic difference between the SLC memories. For example, when a threshold voltage sensed from in a single-bit cell is a voltage level from 0.5 volts to 1.5 volts, data stored in the single-bit cell may be interpreted as logic "1." When a threshold voltage sensed from in a single-bit cell is a voltage level from 2.5 volts to 3.5 volts, data stored in the single-bit cell may be interpreted as logic "0."

To satisfy a need for a high integration of a memory, a Multi-Level Cell (MLC) memory capable of storing more than two bits in a single memory cell may be used. The MLC memory may be also referred to as a multi-bit cell (MBC) memory. However, as a number of bits stored in a single memory cell increases, a cell's reliability may be compromised and thus increase the read failure rate. If a single memory cell stores m-bits data, a level of a threshold voltage formed in the single memory cell may be any one of $2^m$ voltage levels. Due to fine electric difference of each of the memory cells, if each of memory cells stores m-bit data, the threshold voltages in the memory cells may form $2^m$ voltage level distributions.

Since a voltage window may be limited, a threshold voltage difference between neighboring distributions may decrease as "m" increases, and the neighboring distributions may overlap with each other as "m" increases even more. When the neighboring distributions overlap with each other, the read failure rate with respect to data read from memory cells may increase.

An ECC encoding and/or ECC decoding scheme may be selected for an MLC memory to store data in the MLC memory, to detect an error while the data is read from the MLC memory and to correct the detected error.

The memory cell array 110 may include a plurality of multi-bit cells capable of storing multi-bit data. The decoder 120 may read the second data from multi-bit cells when the first data is read.

The first and second data may be data stored in the multi-bit cells of the sub array 111. The first and second data may correspond to data stored in identical multi-bit cells, but may correspond to data forming different bit layers. For example, the decoder 120 may read first data forming a bit layer of a most significant bit from the multi-bit cells of the sub array 111, and may read second data forming a bit layer of a least significant bit (LSB) from the multi-bit cells of the sub array 111.

Data forming a bit layer may be referred to as forming a page. A set of multi-bit cells, which are connected to a single word line, may be referred to as a memory page, and data which is stored in multi-bit cells of a single memory page and forms a single-bit layer may be referred to as a data page. These terms are used for the sake of convenience and should not be construed as being limited to use with the terms main page and sub-page If multi-bit cells store four-bit data, four-bit layers may exist. When a bit layer of a MSB is a first bit layer, and when a bit layer of an LSB is a fourth bit layer, the decoder 120 may read data forming the first bit layer as first data and read data forming the second bit layer as second data. The decoder 120 may select a first decoding scheme corresponding to the first data based on characteristics of the first channel, and may select a second decoding scheme corresponding to the second data based on characteristics of the second channel.

Depending on example embodiments, the decoder 120 may read data forming a first bit layer as first data, read data forming a second bit layer as second data, read data forming a third bit layer as third data, and read data forming a fourth bit layer as fourth data. Depending on example embodiments, the decoder 120 may select a first decoding scheme to perform ECC decoding with respect to a first and second code word, and select a second decoding scheme to perform ECC decoding with respect to a third and fourth codeword. Alternatively, the decoder 120 may select a first decoding scheme to perform ECC decoding with respect to a first code word, select a second decoding scheme to perform ECC decoding with respect to a second codeword, select a third decoding scheme to perform ECC decoding with respect to a third codeword, and select a fourth decoding scheme to perform ECC decoding with respect to a fourth codeword.

Depending on example embodiments, a bit layer corresponding to a MSB may experience a transition in responses to changes of threshold voltages of multi-bit cells. The transition may be an event where a data value of a bit layer changes from "1" to "0" or "0" to "1". In a bit layer corresponding to an MSB, "1" may be stored in multi-bit cells having a smaller threshold voltage than a read voltage, and "0" may be stored in multi-bit cells having a larger threshold voltage than the read voltage. A bit layer corresponding to an LSB may experience $2^{(m-1)}$ transitions with respect to changes in threshold voltages of multi-bit cells. To verify data of a bit layer corresponding to the LSB, $2^{(m-1)}$ number of read voltage levels may be required.

Depending on example embodiments, the sub array 111 may correspond to a single data page, first data may correspond to a first data page forming a bit layer of a MSB, and second data may correspond to a second data page forming a bit layer of a LSB. The first channel may correspond to an operation of reading the first data page using a single read voltage level, and the second channel may correspond to an operation of reading the second data page using $2^{(m-1)}$ number of read voltages. As the number of transitions occurring is larger, an error rate in a channel corresponding to a bit layer may increase. Since the bit layer of the LSB experiences more transition than the bit layer of the MSB, an error rate in the second channel may be larger than an error rate in the first channel. In an ECC encoding and/or decoding scheme, as a larger number of redundant information may be used, a larger number of errors may be corrected. When an error rate in the second channel is larger than an error rate in the first channel, the decoder 120 may select the second decoding scheme having a larger error correctability than the first decoding scheme.

According to example embodiments, sequences of ECC decodings may be determined according to bit layers of multi-bit cells. In example embodiments, data to be ECC decoded and previously ECC decoded data may be combined to perform ECC decoding while further ECC decoding may be performed with respect to data according to the determined sequences, thereby implementing a ECC decoding scheme optimized for characteristics of channels that change according to bit layers of multi-bit cells. According to embodiments, it may be possible to increase error correctability in a critical page having a largest error rate. Also, according to example embodiments, it may be possible to increase error correctability in general pages.

Depending on example embodiments, the decoder 120 may include a first inner decoding module (not shown) corresponding to a decoding scheme of the first codeword and a second inner decoding module (not shown) corresponding to a decoding scheme of the second codeword. The first inner decoding module may perform ECC decoding with respect to the first codeword to estimate a first message, and the second inner decoding module may perform ECC decoding with respect to the second codeword to estimate a second message. In this instance, each of the first and second inner decoding modules may reduce hardware complexity since each of the first and second inner decoding modules may form a simple path for data. Operations using a plurality of decoding modules will be described in further detail in FIG. 2.

Figure 2:
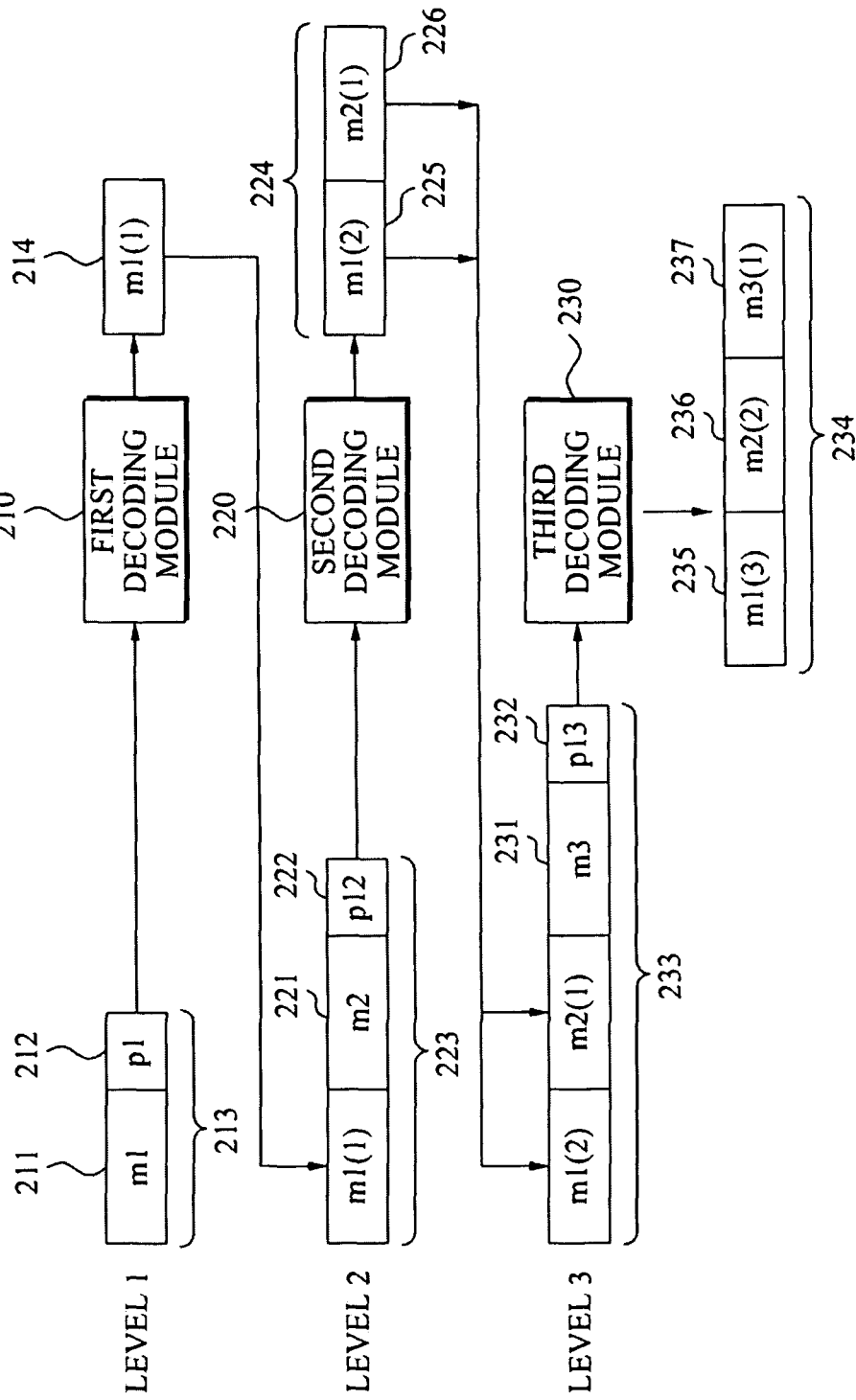
FIG. 2 is a diagram illustrating decoding operations of the decoder of FIG. 1, according to example embodiments.

FIG. 2 is a diagram illustrating decoding operations of the decoder 120 of FIG. 1, according to example embodiments.

Referring to FIG. 2, the decoder 120 includes a first decoding module 210, a second decoding module 220, and a third decoding module 230. The first decoding module 210 may perform ECC decoding with respect to a first bit layer (or a level 1). The second decoding module 220 may perform ECC decoding with respect to a second bit layer (or a level 2). The third decoding module 230 may perform ECC decoding with respect to a third bit layer (or a level 3).

The first decoding module 210 may perform ECC decoding with respect to a first codeword 213. The first codeword 213 may include a first message m1 211 and a first parity p1 212, which may be read from the memory cell array 110. The first decoding module 210 may generate a first message m1(1) 214, which may be estimated by performing ECC decoding with respect to the first codeword 213.

The second decoding module 220 may perform ECC decoding with respect to a second codeword 223. The second codeword 223 may include the estimated first message m1(1) 214, a second message m2 221, and a second parity p12 222, which may be read from the memory cell array 110. The second decoding module 220 may generate an estimated second message m2(1) 226 and a re-estimated first message m1(2) 225, which are estimated by performing ECC decoding with respect to the second codeword 223. The second parity p12 222 may correspond to redundant information from an ECC encoding operation, which is performed before the first message m1 211 and the second message m2 221 are stored in the memory cell array 110.

The third decoding module 230 may perform ECC decoding with respect to a third codeword 233. The third codeword 233 may include a third message m3 231 and a third parity p13 232, which may read from the memory cell array 110, and the results 224 of performing ECC decoding by the second decoding module 220. The results 224 of performing ECC decoding by the second decoding module 220 may include the estimated second message m2(1) 226 and a re-estimated first message m1(2) 225. The third parity p13 232 may correspond to redundant information from an ECC encoding operation which is performed before the first message m1 211, the second message m2 221, and the third message m3 231 are stored in the memory cell array 110. The third decoding module 230 may generate an estimated third message m3(1) 237, a re-estimated second message m2(2) 236, and a triple-estimated first message m1(3) 235, which are estimated by performing ECC decoding with respect to the third codeword 233.

The memory device 100 of FIG. 1 may output a result of the ECC decoding by the third decoding module 230 as a result of final decoding.

Since the first message m1 211 being read from the memory cell array 110 may be triple-ECC decoded and may be outputted as the triple-estimated first message m1(3) 235, improvement of a BER may be greater than the second message m2 221 or the third message m3 231.

Since the third message m3 231 read from the memory cell array 110 may be ECC decoded with ECC decoded messages 225 and 226, which may be decoded in advance more than once, an error in the third message m3 231 may be corrected by the third decoding module 230 even when a BER of the third message m3 231 is greater than a threshold error rate.

Figure 3:
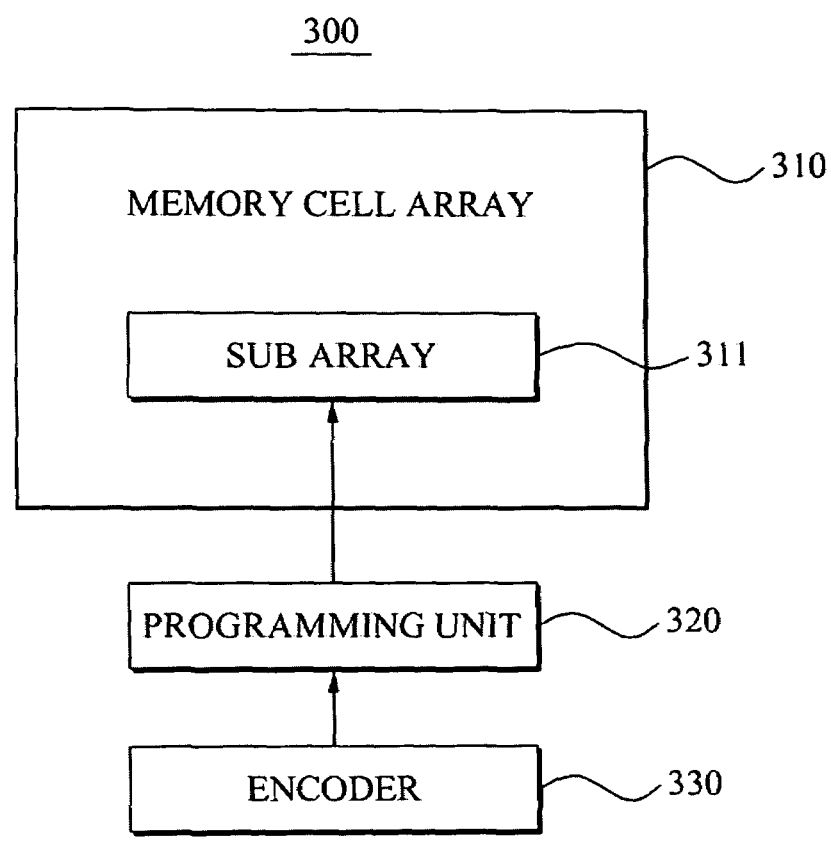
FIG. 3 is a diagram illustrating another memory device according to example embodiments.

FIG. 3 is a diagram illustrating another memory device 300 according to example embodiments.

Referring to FIG. 3, the memory device 300 includes a memory cell array 310, a programming unit 320, and an encoder 330.

The memory cell array 310 includes a sub array 311. The sub array 311 may be a set of memory cells which are simultaneously programmed by the programming unit 320. The sub array 311 may be a set of memory cells connected to a single word line.

The encoder 330 may perform ECC encoding with respect to a first message to generate a first codeword, and may perform ECC encoding of the first message and a second message to generate a second codeword.

The programming unit 320 may program the generated first and second codewords in the memory cells in the sub array 311.

Codewords ECC encoded by the encoder 330 may be ECC decoded according to a decoding scheme corresponding to an encoding scheme of the encoder 330. A path for storing codewords in memory cells and reading the stored codeword from the memory cells may refer to a channel, and the codewords may include an error while passing through the channel.

The decoding scheme may correct errors of the codewords by performing ECC decoding with respect to codewords having a BER less than a threshold correction range. The memory device 300 may estimate a BER of a codeword passing through a channel according to characteristics of the channel, establish a decoding scheme having a performance capable of correcting an error larger than the estimated BER, and establish an encoding scheme corresponding to the established decoding scheme.

An ECC encoding operation may generate a codeword by adding redundant information to a message. The message may also be referred to as effective information. The redundant information may be used to correct an error that may be possibly included in an operation of a message while passing through a channel. As a size ratio of the redundant information increases with respect to the size of the effective information, an ECC decoding may correct more errors. An example of redundant information may be parity.

When a long codeword is generated by combining a codeword having a comparatively larger BER and a codeword having a comparatively smaller BER, a BER of the generated long codeword may be a weighted average of the BERs of the two combined codewords.

Depending on example embodiments, the memory cell array 310 may include a plurality of multi-bit cells capable of storing multi-bit data. The programming unit 320 may store the ECC encoded second codeword in the multi-bit cells which store the ECC encoded first codeword.

Depending on example embodiments, the sub array 311 may be a memory page including multi-bit cells connected to a single word line. The programming unit 320 may store the ECC encoded first codeword in a bit layer of an MSB of the sub array 311, and may store the ECC encoded second codeword in a bit layer of an LSB of the sub array 311.

Depending on example embodiments, each of the multi-bit cells of the memory cell array 310 may store m-bits of data. In this instance, the bit layer of MSB of the sub array 311 may correspond to a first bit layer, and the bit layer of LSB of the sub array 311 may correspond to an $m^{th}$ bit layer. Each of the multi-bit cells of the sub array 311 may have m numbers of bit layers. The programming unit 320 may store the ECC encoded first codeword in the first bit layer of the sub array 311, and store the ECC encoded second codeword in the second bit layer of the sub array 311.

Depending on example embodiments, each of the multi-bit cells of the memory cell array 310 may store four-bit data. In this instance, each of the multi-bit cells of the memory cell array 310 may have four bit layers.

The programming unit 320 may store the ECC encoded first codeword in the first bit layer, which may be a bit layer of the MSB of the sub array 311, and may store the ECC encoded second codeword in the second bit layer of the sub array 311. The programming unit 320 may store an ECC encoded third codeword in a third bit layer of the sub array 311, and may store an ECC encoded fourth codeword in a fourth bit layer of a bit layer of the LSB.

A first channel may correspond to an operation where the ECC encoded first codeword is stored in the first bit layer of the sub array 311, and a second channel may correspond to an operation where the ECC encoded second codeword is stored in the second bit layer of the sub array 311. A third channel may correspond to an operation where the ECC encoded third codeword is stored in the third bit layer of the sub array 311, and a fourth channel may correspond to an operation where the ECC encoded fourth codeword is stored in the fourth bit layer of the sub array 311.

The encoder 330 may perform ECC encoding with respect to the first message to generate a first codeword. The first codeword may include an ECC encoded first message and an ECC encoded first parity.

The encoder 330 may perform ECC encoding with respect to the first message and a second message to generate a second codeword. The second codeword may include the ECC encoded first message, an ECC encoded second message, and an ECC encoded second parity. The ECC encoded second parity may include redundant information about the first and second message.

The encoder 330 may perform ECC encoding with respect to the first, second, and third message to generate a third codeword. The third codeword may include the ECC encoded first message, the ECC encoded second message, an ECC encoded third message, and an ECC encoded third parity. The ECC encoded third parity may include redundant information about the first, second, and third message.

The encoder 330 may perform ECC encoding with respect to the first, second, third, fourth message to generate a fourth codeword. The fourth codeword may include the ECC encoded first message, the ECC encoded second message, the ECC encoded third message, an ECC encoded fourth message, and an ECC encoded fourth parity. The ECC encoded fourth parity may include redundant information about the first, second, third, fourth message.

Since the first bit layer may correspond to a MSB, the first bit layer may experience a transition once ($2^0$) and the second bit layer may experience transition twice($2^1$). The third bit layer may experience transition four times ($2^2$) and the fourth bit layer may experience transition eight times ($2^3$). Since the number of transitions experienced by each successive bit layer increases, an error rate in a channel corresponding to that bit layer may also increase. For example, a fourth channel may be estimated to have a largest error rate.

The encoder 330 may estimate an error rate of each channel based on a number of transitions of each bit layer. The encoder 330 may adjust a size rate of a message and redundant information about a channel to lower an error rate which may be included while a codeword passes through a channel. A decoding scheme may correspond to the encoding scheme of the encoder 330. Error correctability may increase as a larger size of redundant information is added to the message.

Depending on example embodiments, the encoder 330 may establish sizes of the effective information and redundant information of the first codeword according to characteristics of the first channel. The encoder 330 may generate the first codeword using the established sizes of the effective information and redundant information. The encoder 330 may establish the sizes of effective information and redundant information of the second codeword according to characteristics of the second channel. Depending on example embodiments, the encoder 330 may reduce a required dimension for a circuit to embody hardware since the encoder 330 may generate the first and second codeword using a single encoding path.

The encoder 330 may establish a largest redundant information rate in the fourth channel and establish a smaller redundant information rate than that of the fourth channel in at least one of the other channels. For example, the encoder 330 may establish a smallest redundant information rate in the first channel.

The encoder 330 may select a channel corresponding to a bit layer of a LSB having a largest error rate as the fourth channel, and select a channel corresponding to a bit layer of an MSB having a smallest error rate as the first channel.

Messages passing through the fourth channel may be combined with messages passing through the first, second, third channels, which may have comparatively smaller error rates, to generate the fourth codeword, and the fourth codeword may be ECC encoded to be stored in the memory cell array 310. The ECC encoded fourth codeword may be read from the memory cell array 310, the read fourth codeword may be ECC decoded, thereby restoring the fourth codeword. In the operation of performing the ECC decoding with respect to the fourth codeword, ECC decoding results of the messages passing through the first, second, third channel having a comparatively smaller error rate may be used. Decoding operations may lower the BER of the fourth codeword based on the ECC decoding results of the messages passing through the first, second, third channel. Since the memory device 300 may lower the BER of the codeword having passed through the fourth channel, where the fourth channel may have the poorest channel characteristics, error correctability may be increased in a critical data page.

Depending on example embodiments, the encoder 330 may select a channel corresponding to a fourth bit layer, which may be a bit layer of a LSB, as a first channel, and select a channel corresponding to a first bit layer, which may be a bit layer of a MSB, as a fourth channel. Data which is ECC encoded by the encoder 330 may be ECC decoded by the decoder 120 of FIG. 1. The decoder 120 may maximize error correction with respect to the first message by performing ECC decoding with respect to the first message a plurality of times. Therefore, the encoder 330 may select a channel corresponding to a bit layer of a LSB having a largest error rate as a first channel. The encoder 330 may select a channel corresponding to a bit layer of an MSB having a smallest error rate as a fourth channel. In this case, the decoder 120 may decode a message passing through the first channel having the poorest characteristics repeatedly. Accordingly, the encoder 330 and the decoder 120 may increase error correctability of the message passing through the first channel, which may have the poorest or most inferior characteristics.

According to example embodiments, data passing through different channels may be sequentially combined to generate codewords, and the generated codewords may be ECC encoded, thereby adjusting an error rate in each data page of a multi-bit cell memory.

According to example embodiments, error correctability may be increased in a critical data page having largest error rate since an error rate may be adjusted in each data page of a multi-bit cell memory.

Depending on example embodiments, the encoder 330 may increase error correctability in each data page by adjusting the amount of redundant information rate of each channel.

When the redundant information rate of each channel is adjusted, a different encoding scheme may be selected for each channel. The encoder 330 may select a first encoding scheme for a first channel, and select a second encoding scheme for a second channel. Depending on example embodiments, the encoder 330 may select a different type of encoding scheme for each channel.

Depending on example embodiments, the encoder 330 may select an identical type of ECC encoding scheme for each channel, and may adjust performance of codes using extending, shortening, puncturing, and the like when required.

The encoder 330 may select use of a different encoding scheme for each channel (different encoding scheme may include rates of different redundant information), and perform ECC encoding with respect to data that passes through each channel via a different encoding path. For example, the encoder 330 may include a first encoding module and a second encoding module. The encoder 330 may apply a first encoding scheme to a first channel. The first encoding module may correspond to the first encoding scheme, and perform ECC encoding with respect to the first message to generate the first codeword. The encoder 330 may apply a second encoding scheme to a second channel. The second encoding module may correspond to the second encoding scheme, and perform ECC encoding with respect to the first and second message to generate the second codeword.

Depending on example embodiments, the encoder 330 may perform ECC encoding with respect to data that passes through each channel via a single encoding path.

Depending on example embodiments, the encoder 330 may apply a different type of ECC encoding scheme for each channel. For example, a first encoding scheme may correspond to an ECC encoding scheme using BCH codes, and the second encoding scheme may correspond to an ECC encoding scheme using RS codes.

Figure 4:
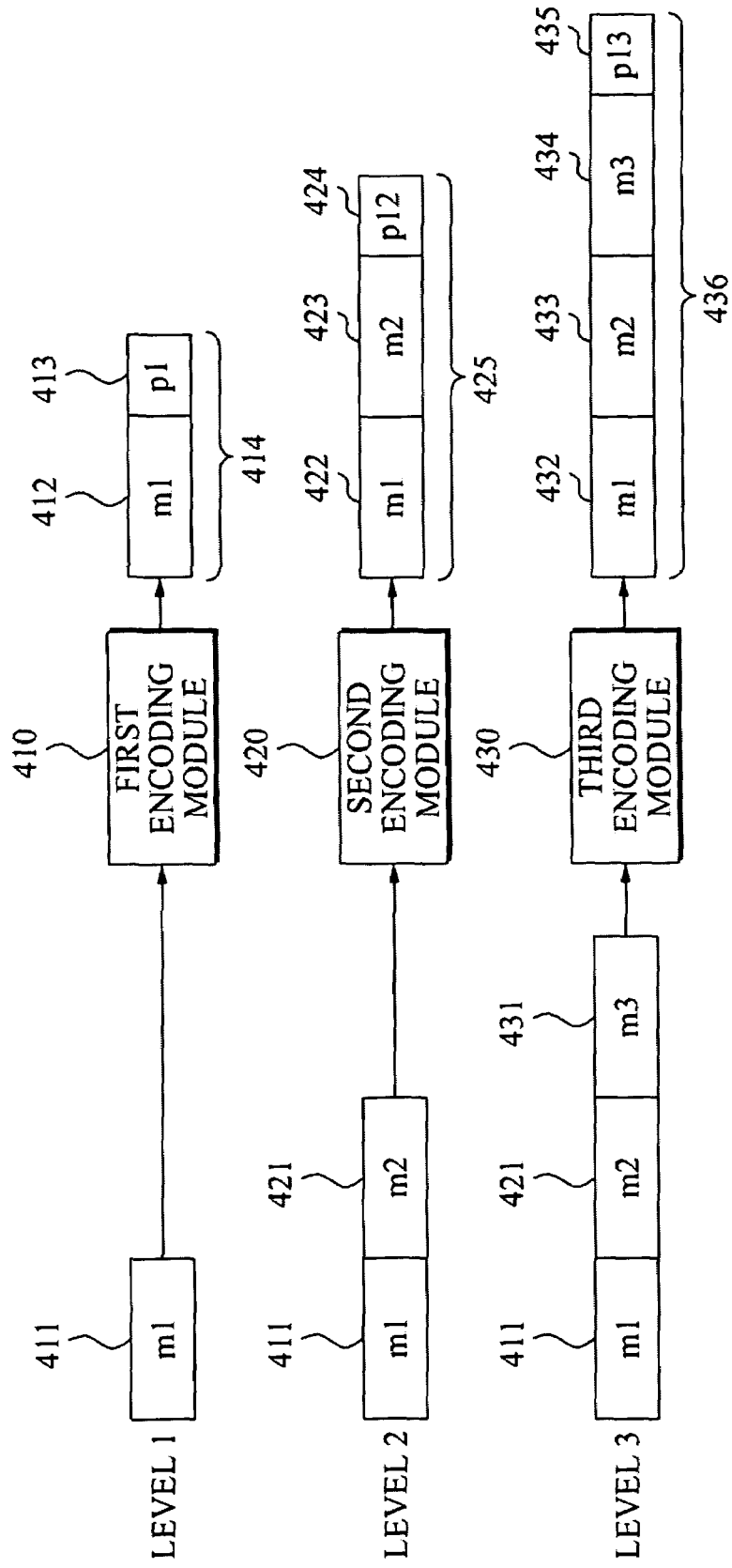
FIG. 4 is a diagram illustrating an encoding operation of the memory device of FIG. 3, according to example embodiments.

FIG. 4 is a diagram illustrating an encoding operation of the memory device 300 of FIG. 3, according to example embodiments.

Referring to FIG. 4, the encoder 330 of FIG. 3 includes a first encoding module 410, a second encoding module 420, and a third encoding module 430.

The first encoding module 410 may perform ECC encoding with respect to a first message m1 411 that passes through a channel corresponding to a first bit layer (or a level 1) to generate a first codeword 414. The first codeword 414 may include an ECC encoded first message m1 412 and an ECC encoded first parity p1 413. The first parity p1 413 may correspond to redundant information to detect and correct an error in the first message m1 411.

The second encoding module 420 may perform ECC encoding with respect to the first message m1 411 and a second message m2 421 that pass through a channel corresponding to a second bit layer (or a level 2) to generate a second codeword 425. The second codeword 425 may include an ECC encoded first message m1 422, an ECC encoded second message 423, and an ECC encoded second parity p12 424. The second parity p12 424 may correspond to redundant information to detect and correct an error in the first message m1 411 and the second message m2 421

The third encoding module 430 may perform ECC encoding with respect to the first message m1 411, the second message m2 421, and a third message m3 431 to generate a third codeword 436. The third codeword 436 may include an ECC encoded first message m1 432, an ECC encoded second message m2 433, an ECC encoded third message m3 434, and an ECC encoded third parity p13 435. The third parity p13 435 may correspond to redundant information to detect and correct an error in the first message m1 411, the second message m2 421, and the third message m3 431.

Figure 5:
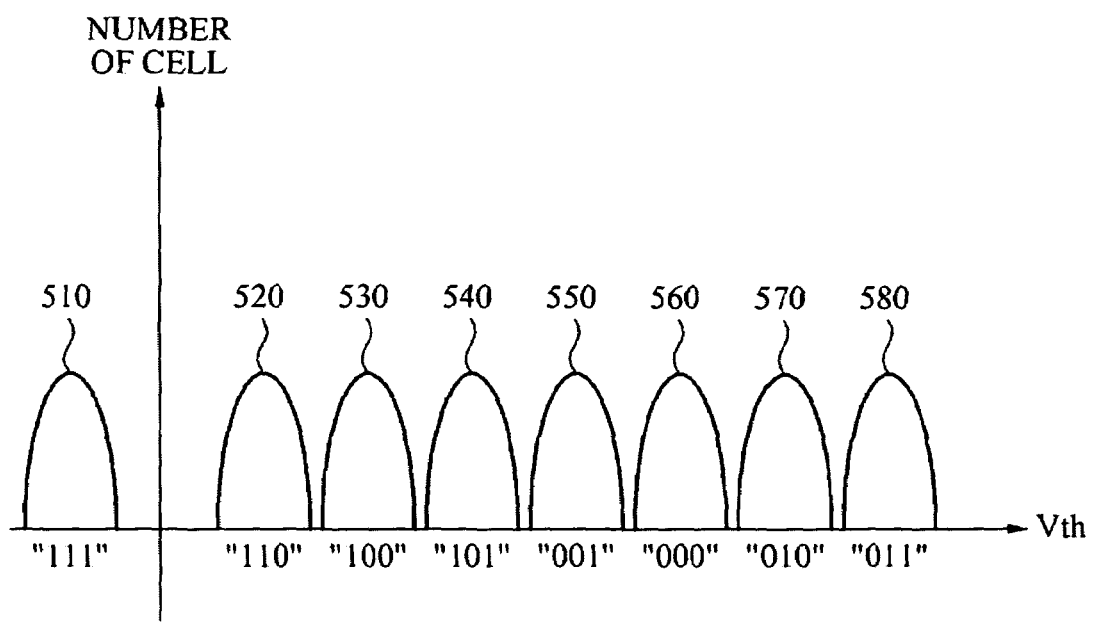
FIG. 5 is a graph illustrating distributions of a threshold voltage of multi-bit cells, which are formed due to data pages being generated by an ECC encoding method of FIG. 4, according to example embodiments.

FIG. 5 is a graph illustrating distributions of a threshold voltage of multi-bit cells, which are formed due to data pages being generated by an ECC encoding method of FIG. 4, according to example embodiments.

Referring to FIG. 5, an x-axis indicates threshold voltages of multi-bit cells, and a y-axis indicates a number of the multi-bit cells having corresponding threshold voltages.

For example, a multi-bit cell, in which "0" is stored while a first data page is stored, "1" is stored while a second data page is stored, and "0" is stored while a third data page is stored, may store the data "010".

A distribution 510 indicates a distribution of a threshold voltage of multi-bit cells storing the data "111."

A distribution 520 indicates a distribution of a threshold voltage of multi-bit cells storing the data "110."

A distribution 530 indicates a distribution of a threshold voltage of multi-bit cells storing the data "100."

A distribution 540 indicates a distribution of a threshold voltage of multi-bit cells storing the data "101."

A distribution 550 indicates a distribution of a threshold voltage of multi-bit cells storing the data "001."

A distribution 560 indicates a distribution of a threshold voltage of multi-bit cells storing the data "000."

A distribution 570 indicates a distribution of a threshold voltage of multi-bit cells storing the data "010."

A distribution 580 indicates a distribution of a threshold voltage of multi-bit cells storing the data "011."

The MSB layer may experience a transition from "1" to "0" between the distribution 540 and the distribution 550 as a threshold voltage increases. A second bit layer may experience a first transition from "1" to "0" between the distribution 520 and the distribution 530 and a second transition from "0" to "1" between the distribution 560 and the distribution 570 as a threshold voltage increases.

The LSB layer may experience a first transition from "1" to "0" between the distribution 510 and the distribution 520 and a second transition from "0" to "1" between the distribution 530 and the distribution 540 as a threshold voltage increases. The LSB layer may further experience a third transition from "1" to "0" between the distribution 550 and the distribution 560 and a fourth transition from "0" to "1" between the distribution 570 and the distribution 580 as a threshold voltage increases.

Figure 6:
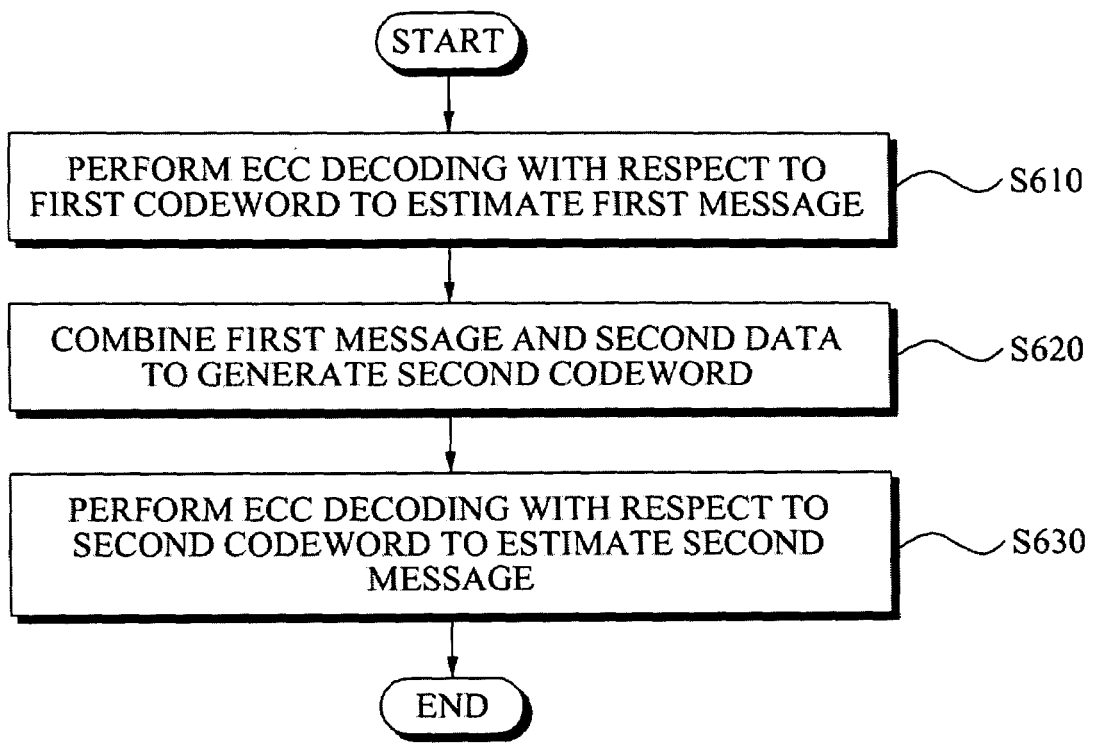
FIG. 6 is a flowchart illustrating a decoding method according to example embodiments.

FIG. 6 is a flowchart illustrating a decoding method according to example embodiments.

Referring to FIG. 6, in operation S610, the decoding method may perform ECC decoding with respect to a first codeword to estimate a first message. The first codeword may be generated from received first data. Depending on example embodiments, the first codeword may be identical or similar to the first data.

In operation S620, the decoding method may combine the estimated first message and received second data to generate a second codeword.

The decoding method may perform ECC decoding with respect to the second codeword to estimate a second message in operation S630.

The estimated second message may include a re-estimated value of the estimated first message.

In operation S620, at least a portion corresponding to the estimated first message from among the received second data may be substituted with the estimated first message.

Figure 7:
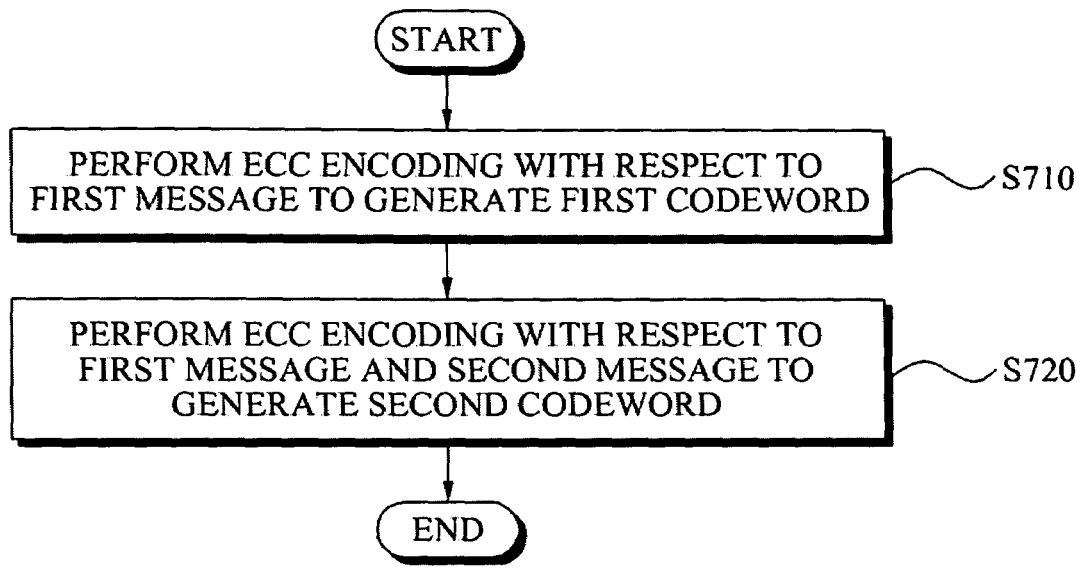
FIG. 7 is a flowchart illustrating an encoding method according to example embodiments.

FIG. 7 is a flowchart illustrating an encoding method according to example embodiments.

Referring to FIG. 7, in operation S710, the encoding method may perform ECC encoding with respect to a first message to generate a first codeword.

In operation S720, the encoding method may perform ECC encoding with respect to the first message and a second message to generate a second codeword.

The encoding method may store the first codeword in multi-bit cells.

The encoding method may store the second codeword in the multi-bit cells storing the first codeword by selecting a multi-bit programming scheme. The multi-bit programming scheme may be performed as described above with reference to FIG. 5.

The encoding method may combine the first codeword and the second codeword passing through different channels to generate a long codeword. A BER of the long codeword may be a weighted average value of BERs of the first and second codeword. Therefore, the encoding method may increase error correctability in a critical page of a multi-bit cell memory.

The ECC encoding and/or decoding method according to the above-described example embodiments may be recorded in computer-readable media including program instructions to implement various operations embodied by a computer. The media may also include, alone or in combination with the program instructions, data files, data structures, and the like. Examples of computer-readable media include magnetic media such as hard disks, floppy disks, and magnetic tape; optical media such as CD ROM disks and DVD; magneto-optical media such as optical disks; and hardware devices that are specially configured to store and perform program instructions, such as read-only memory (ROM), random access memory (RAM), flash memory, and the like Examples of program instructions include both machine code, such as produced by a compiler, and files containing higher level code that may be executed by the computer using an interpreter. The described hardware devices may be configured to act as one or more software modules in order to perform the operations of the above-described example embodiments, and vice versa.

Flash memory devices and/or memory controllers according to example embodiments may be embodied using various types of packages. For example, the flash memory devices and/or memory controllers may be embodied using packages such as Package on Packages (PoPs), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Quad Flatpack (QFP), Small Outline Integrated Circuit (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The flash memory devices and/or the memory controllers according to example embodiments may constitute memory cards. In this case, the memory controllers may be constructed to communicate with an external device for example, a host using any one of various types of interface protocols such as a Universal Serial Bus (USB), a Multi Media Card (MMC), a Peripheral Component Interconnect-Express (PCI-E), Serial Advanced Technology Attachment (SATA), Parallel ATA (PATA), Small Computer System Interface (SCSI), Enhanced Small Device Interface (ESDI), and Integrated Drive Electronics (IDE).

The flash memory devices according to example embodiments may be non-volatile memory devices that may maintain stored data even when power is cut off. According to an increase in the use of mobile devices such as a cellular phone, a personal digital assistant (PDA), a digital camera, a portable game console, and an MP3 player, the flash memory devices may be more widely used as data storage and code storage. The flash memory devices may be used in home applications such as a high definition television (HDTV), a digital video disk (DVD), a router, and a Global Positioning System (GPS).

A computing system according to example embodiments may include a microprocessor that is electrically connected with a bus, a user interface, a modem such as a baseband chipset, a memory controller, and a flash memory device. The flash memory device may store N-bit data via the memory controller. The N-bit data may be processed by the microprocessor, where N may be an integer. When the computing system is a mobile apparatus, a battery may be additionally provided to supply operation voltage of the computing system.

It will be apparent to those of ordinary skill in the art that the computing system according to example embodiments may further include an application chipset, a camera image processor (CIS), a mobile Dynamic Random Access Memory (DRAM), and the like. The memory controller and the flash memory device may constitute a solid state drive/disk (SSD) that uses a non-volatile memory to store data.

Although example embodiments have been disclosed for illustrative purposes, those skilled in the art will appreciate that various modifications, additions and substitutions are possible, without departing from the scope and spirit of example embodiments as disclosed in the accompanying claims.

What is claimed is:

1. A memory device, comprising:
   a memory cell array; and
   a processor including at least one of a decoder and an encoder, wherein
   the processor is configured to adjust a redundant information rate of each of a plurality of channels, where each of the channels is a path of the memory cell array from which data is at least one of stored and read,
   the redundant information rate is adjusted by generating at least one codeword based on information from a previous codeword,
   the processor includes the decoder, the decoder being configured to perform error-control code (ECC) decoding with respect to a first codeword generated from first data read from the memory cell array to estimate a first message, to combine the estimated first message and second data read from the memory cell array to generate a second codeword, and to perform ECC decoding with respect to the second codeword to estimate a second message, and
   the ECC decoding is performed according to a decoding scheme which uses systematic codes, the ECC decoding including dividing the first codeword into the first message and a first parity, and dividing the second codeword into the second message and a second parity, where each of the first parity and the second parity is redundant information for an occurrence of an error.

2. The memory device of claim 1, wherein the memory cell array includes a plurality of multi-bit cells storing multi-bit data, and the decoder reads the second data from the plurality of multi-bit cells from which the first data is read.

3. The memory device of claim 1, wherein the second message includes a re-estimated value of the first message.

4. The memory device of claim 1, wherein the decoder substitutes at least a portion of the first message in the second data with the estimated first message to generate the second codeword.

5. The memory device of claim 1, wherein,
   the decoder reads the first data from the memory cell array via a first channel, selects a first decoding scheme based on characteristics of the first channel, performs ECC decoding with respect to the first codeword based on the selected first decoding scheme, and wherein
   the decoder reads the second data from the memory cell array via a second channel, and selects a second decoding scheme based on characteristics of the second channel, and performs ECC decoding with respect to the second codeword based on the selected second decoding scheme.

6. The memory device of claim 5, wherein the decoder includes,
   a first decoding module corresponding to the first decoding scheme configured to perform ECC decoding with respect to the first codeword to estimate the first message; and
   a second decoding module corresponding to the second decoding scheme configured to perform ECC decoding with respect to the second codeword to estimate the second message.

7. The memory device of claim 5, wherein the decoder establishes a size of a message and redundant information of the first codeword based on the first decoding scheme to perform ECC decoding with respect to the first codeword, and establishes a size of a message and redundant information of the second codeword based on the second decoding scheme to perform ECC decoding with respect to the second codeword.

8. A memory device, comprising:
   a memory cell array;
   a processor including at least one of a decoder and an encoder, the processor being configured to adjust a redundant information rate of each of a plurality of channels, where each of the channels is a path of the memory cell array from which data is at least one of stored and read, and the redundant information rate being adjusted by generating at least one codeword based on information from a previous codeword; and
   a programming unit storing a first and second codeword in the memory cell array, wherein
   the processor includes the encoder, with the encoder configured to perform error-control codes (ECC) encoding with respect to a first message to generate a first codeword, and performing ECC encoding with respect to the first message and a second message to generate a second codeword, and
   the ECC encoding is performed according to a encoding scheme which uses systematic codes, the ECC encoding including generating a first parity based on the first message, the first codeword including the first parity and the first message, and generating a second parity based on the second message, the second codeword including the second parity and the second message, where each of the first parity and the second parity is redundant information for an occurrence of an error.

9. The memory device of claim 8, wherein the memory cell array includes a plurality of multi-bit cells storing multi-bit data, and the programming unit stores the second codeword in the plurality of multi-bit cells storing the first codeword.

10. The memory device of claim 8, wherein,
    the encoder selects a first encoding scheme based on characteristics of the first channel storing the first codeword and performs ECC encoding with respect to the first message based on the selected first encoding scheme, and wherein
    the encoder selects a second encoding scheme based on characteristics of the second channel storing the second codeword and performs ECC encoding with respect to the second message based on the selected second encoding scheme.

11. The memory device of claim 10, wherein the encoder includes,
    a first encoding module corresponding to the first encoding scheme configured to perform ECC encoding with respect to the first message to generate the first codeword; and
    a second encoding module corresponding to the second encoding scheme configured to perform ECC encoding with respect to the first and second message to generate the second codeword.

12. The memory device of claim 10, wherein the encoder establishes a size of a message and redundant information of the first codeword based on the first encoding scheme to perform ECC encoding with respect to the first message, and establishes a size of a message and redundant information of the second codeword based on the second encoding scheme to perform ECC encoding with respect to the second message.

13. A coding method, comprising:
    performing at least one of error-control code (ECC) decoding and encoding, with a redundant information rate of each of a plurality of channels being adjusted, where each of the channels is a path of a memory cell array from which data is at least one of stored and read, and the redundant information rate is adjusted by generating at least one codeword based on information from a previous codeword;

performing error-control codes (ECC) decoding with respect to a first codeword generated from received first data to estimate a first message;

combining the estimated first message and received second data to generate a second codeword; and performing ECC decoding with respect to the second codeword to estimate a second message, wherein the ECC decoding performed on the first codeword and the ECC decoding performed on the second codeword are both performed according to a decoding scheme which uses systematic codes, the ECC decoding performed on the first codeword includes dividing the first codeword into the first message and a first parity, and the ECC decoding performed on the second codeword includes dividing the second codeword into the second message and a second parity, where each of the first parity and the second parity is redundant information for an occurrence of an error.

14. The coding method of claim 13, wherein the second message includes a re-estimated value of the estimated first message.

15. The coding method of claim 13, wherein the performing ECC decoding with respect to the second codeword includes substituting at least a portion of the first message of the second data with the estimated first message.

16. A computer-readable storage medium encoded with a computer program for implementing the method of claim 13.

17. A coding method, comprising:
    performing at least one of error-control code (ECC) decoding and encoding, with a redundant information rate of each of a plurality of channels being adjusted, where each of the channels is a path of a memory cell array from which data is at least one of stored and read, and the redundant information rate is adjusted by generating at least one codeword based on information from a previous codeword performing error-control codes (ECC) encoding with respect to a first message to generate a first codeword; and performing ECC encoding with respect to the first message and a second message to generate a second codeword, wherein the ECC encoding performed on the first codeword and the ECC encoding performed on the second codeword are both performed according to an encoding scheme which uses systematic codes, the ECC encoding performed on the first codeword includes generating a first parity based on the first message, the first codeword including the first parity and the first message, and the ECC encoding performed on the second codeword includes generating a second parity based on the second message, the second codeword including the second parity and the second message, where each of the first parity and the second parity is redundant information for an occurrence of an error.

18. The coding method of claim 17, further comprising:
    storing the first codeword in multi-bit cells of the memory cell array; and
    storing the second codeword in the multi-bit cells storing the first codeword based on a multi-bit programming scheme.

19. A computer-readable storage medium encoded with a computer program for implementing the method of claim 17.

* * * * *